(12) United States Patent
Svechtarov

(10) Patent No.: US 8,564,367 B2
(45) Date of Patent: Oct. 22, 2013

(54) POWER AMPLIFIER

(75) Inventor: Iordan Konstantinov Svechtarov, Wijchen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/089,789

(22) Filed: Apr. 19, 2011

(65) Prior Publication Data

US 2012/0126890 A1 May 24, 2012

(30) Foreign Application Priority Data

Apr. 23, 2010 (EP) .................................. 10250822

(51) Int. Cl.
*H03F 3/68* (2006.01)
(52) U.S. Cl.
USPC ...................................... 330/124 R; 330/295
(58) Field of Classification Search
USPC ................................ 330/295, 124 R, 286, 54
See application file for complete search history.

(56) References Cited

U.S. PATENT DOCUMENTS

| 6,329,877 B1 | 12/2001 | Bowen et al. |
| 8,228,123 B2 * | 7/2012 | Blednov .......................... 330/295 |
| 2008/0191801 A1* | 8/2008 | Kim et al. ................. 330/124 R |

FOREIGN PATENT DOCUMENTS

| WO | 97/20385 A1 | 6/1997 |
| WO | 99/52206 A1 | 10/1999 |
| WO | 01/03289 A1 | 1/2001 |
| WO | 2004/057755 A1 | 7/2004 |
| WO | 2004/088837 A2 | 10/2004 |
| WO | 2009/081341 A1 | 7/2009 |

OTHER PUBLICATIONS

Poitau, G. et al. "Experimental Characterization of LINC Outphasing Combiners—Efficiency and Linearity", IEEE Radio and Wireless Conf., pp. 87-90 (Sep. 2004).
Gerhard, W. et al. "Improvement of Power Amplifier Efficiency by Reactive Chireix Combining, Power Back-Off and Differential Phase Adjustment", IEEE Microwave Symp. Dig., pp. 1887-1890 (Jun. 2006).
El-Asmar, M. et al. "Investigation of Chireix PA Performances by Testing One Branch Variable Load Amplifier", IEEE Advances Comp. Tools for Eng. App., , pp. 279-283 (Jul. 2009).
Xu, H. et al. "A Highly Linear 25dBm Outphasing Power Amplifier in 32nm CMOS for WLAN Application", IEEE ESSCIRC, pp. 306-309 (Sep. 2010).
Zhou, Y. et al. "A Distributed Active Transformer Coupled Outphasing Power Combiner", IEEE Mic. Conf. APMS, pp. 2565-2568 (Dec. 2009).
Extended European Search Report for European Patent Appln. No. 10250822.3 (Feb. 1, 2011)xx.

* cited by examiner

*Primary Examiner* — Hieu Nguyen

(57) ABSTRACT

The invention relates to improving the performance of load modulation power amplifiers through the use of coupled transmission line-based power combiners. Exemplary embodiments disclosed include a power amplifier comprising an input connected to first and second amplifier stages and an output stage configured to combine phase shifted amplified outputs from the first and second amplifier stages and to provide an amplified signal at an output of the power amplifier, wherein the output stage comprises coupled first and second transmission lines connected between the output of the first amplifier stage and an output load connection.

20 Claims, 7 Drawing Sheets

BACKGROUND

BACKGROUND

BACKGROUND

BACKGROUND

US 8,564,367 B2

POWER AMPLIFIER

This application claims the priority under 35 U.S.C. §119 of European patent application no. 10250822.3, filed on Apr. 23, 2010, the contents of which are incorporated by reference herein.

FIELD OF INVENTION

The invention relates to improving the performance of load modulation power amplifiers through the use of coupled transmission line-based power combiners.

BACKGROUND OF THE INVENTION

Power amplifiers (PAs) that use load line modulation techniques to improve overall amplifier efficiency have been known for some time. Two well-known examples are in the form of a two-way Doherty amplifier, illustrated in FIG. 1, and a Chireix outphasing amplifier, illustrated in FIG. 2. A two-way Doherty amplifier comprises two amplifier stages 101, 102, a first of these being a peak amplifier 101 and a second being a main amplifier 102. The peak amplifier 101 amplifies a phase-shifted version of the input signal, while the main amplifier 102 amplifies an unshifted version. A combiner stage 103 combines the output signals from the amplifier stages 101, 102 and provides an output amplified signal to a load 104. A Chireix outphasing amplifier operates according to a similar principle, with two amplifier stages 201, 202 providing amplified versions of the input signal to a combiner stage 203, which combines the outputs to provide an amplified output signal to a load 204.

N-way Doherty power amplifiers, where N>2, are also known, one example being a three-way Doherty power amplifier, an example of which is illustrated in FIG. 3. In this type of Doherty amplifier, outputs from a main amplifier 301 and two peak amplifiers 302a, 302b are combined in a combiner stage 303 to provide an amplified output signal to a load 304. The arrangement of phase shifts on the input and output stages of the amplifier can be varied. WO 2009/081341 discloses further alternative examples of such amplifiers, one of which is illustrated in FIG. 4, with a similar arrangement of amplifier stages 401, 402a, 402b but with a different arrangement of phase shifts on the inputs to the amplifier stages and in the combiner stage 403.

All of the above described power amplifier concepts share one similarity, which is the use of an output stage power combiner 103, 203, 303, 403 in various different arrangements and with single or multiple $\lambda/4$ lines.

A $\lambda/4$ (i.e. quarter wavelength) line, when used as combiner, has some limitations related to its frequency properties that can adversely impact the power amplifier, in particular by reducing to a certain extent the operational frequency bandwidth. With increasing complexity of the power combiner this effect becomes more pronounced.

Contemporary power amplifiers of the above type are typically used to amplify digitally modulated signals with a high peak to average ratio (PAR). The efficiency of the power amplifier at moderate power back off levels determines the overall amplifier performance. Based on typical signal statistics, most of the time such power amplifiers will operate with a value of output load significantly deviating from a nominal load of 50 Ω. For instance the main amplifier stage of a 2-way symmetric Doherty power amplifier, when amplifying digitally modulated signals, will tend to experience dynamic excursions of the load that may change from the nominal value to two times the nominal value. For a Chireix outphasing amplifier the load variations tend to be even larger. It is of significant importance that the load conditions do not change with frequency in order to preserve the optimum power amplifier performance over the entire frequency band of operation.

FIG. 5 shows the impedance transformation properties of a $\lambda/4$ line, as used as 2-way Doherty combiner centred at 2 GHz. When the $\lambda/4$ line transforms the load from the nominal value $R_1$ to the double load $2 \times R_1$ the transformation is exact only at the centre frequency. The transformation bandwidth at a voltage standing wave ratio of 1.1:1 is from 1.85 GHz to 2.25 GHz, or a relative bandwidth of 20%. The deviation from the desired load impedance with the change of the operation frequency effectively compromises all important power amplifier parameters such as gain, output power and efficiency.

It is an object of the invention to address one or more of the above mentioned problems.

SUMMARY OF THE INVENTION

In accordance with a first aspect of the invention there is provided a power amplifier comprising an input connected to first and second amplifier stages and an output stage configured to combine phase shifted amplified outputs from the first and second amplifier stages and to provide an amplified signal at an output of the power amplifier, wherein the output stage comprises coupled first and second transmission lines connected between the output of the first amplifier stages and an output load connection.

The use of coupled first and second transmission lines in this way significantly improves the above mentioned deficiency of the $\lambda/4$ line power combiner, allowing the power amplifier to achieve improved operation over a comparable frequency band, or alternatively a similar or better operation over a significantly wider frequency bandwidth.

The principle of the invention may be applied to a power amplifier configured as a Doherty amplifier or as a Chireix outphasing amplifier. In the case of a Doherty amplifier, the first transmission line may be connected between the output of the first amplifier stage and the output of the second amplifier stage and the output load connection of the power amplifier, and the second transmission line connected to the output of the second amplifier stage and coupled to the first transmission line. The first and second transmission lines preferably have a length of a quarter of a wavelength of an operating frequency of the power amplifier. The second transmission line may be connected to the output load connection via a third transmission line having a length of at least a quarter wavelength of the operating frequency of the power amplifier, or alternatively directly connected to the output load connection and the ground. The power amplifier may comprise a third amplifier stage having an output connected to the output load connection and coupled third and fourth transmission lines connected between the output of the second amplifier stage and the output load connection. The power amplifier may further comprise coupled fifth and sixth transmission lines connected between the output of the third amplifier stage and the output load connection.

Where the power amplifier is configured as a Chireix outphasing amplifier, the power amplifier may comprise coupled third and fourth transmission lines connected between the output of the second amplifier stage and the output load connection. The first to fourth transmission lines each preferably have a length of a quarter of a wavelength of an operating frequency of the power amplifier. The input of the second transmission line may be connected to the output load connection via a fifth transmission line and the input of the fourth transmission line connected to the output load connection via a sixth transmission line, the fifth and sixth transmission lines each having a length of at least a quarter wavelength of the operating frequency of the power amplifier.

The operating frequency of the power amplifier, for example as defined by the centre operating frequency, may be within the range 1 to 3 GHz.

In accordance with a second aspect of the invention there is provided a method of operating a power amplifier according to the first aspect, the method comprising:

receiving a signal at an input of the power amplifier;
dividing the signal between the first and second amplifier stages;
amplifying the divided signal by the first and second amplifier stages;
combining the resulting amplified signals from outputs of the first and second amplifiers in the output stage; and
providing an amplified output signal at an output of the power amplifier.

BRIEF DESCRIPTION OF THE DRAWINGS

Exemplary embodiments according to the invention are described in further detail below with reference to the accompanying drawings, in which.

DETAILED DESCRIPTION OF EMBODIMENTS

A main principle according to embodiments of the invention disclosed herein is based on a combination of electrically connected coupled and single transmission lines in an output stage of a power amplifier comprising two or more amplifier stages providing phase shifted amplified outputs of an input signal. Coupled transmission lines are known for use as impedance transforming elements in impedance matching structures, but not as combining structures for load modulation power amplifiers such as Doherty or Chireix power amplifiers, where amplifier operation has to be guaranteed under dynamically varying load conditions.

Figure 1:
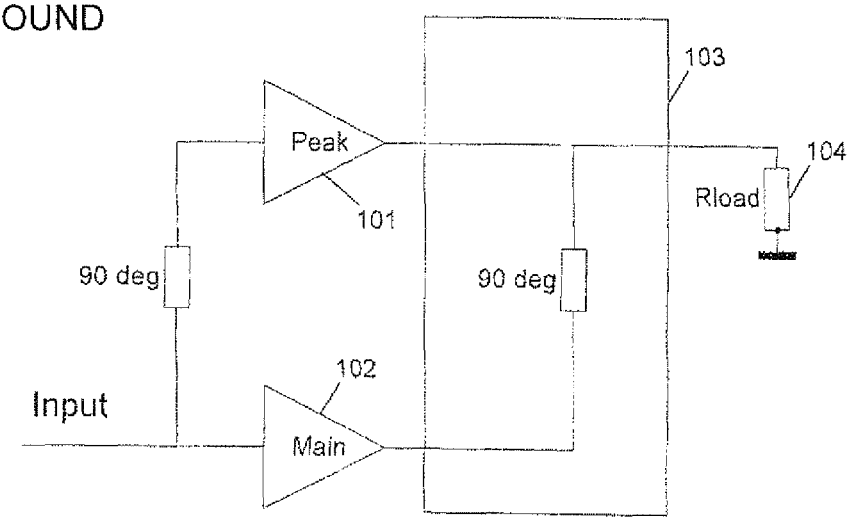
FIG. 1 is a schematic circuit diagram of a conventional two-way Doherty amplifier.
Figure 2:
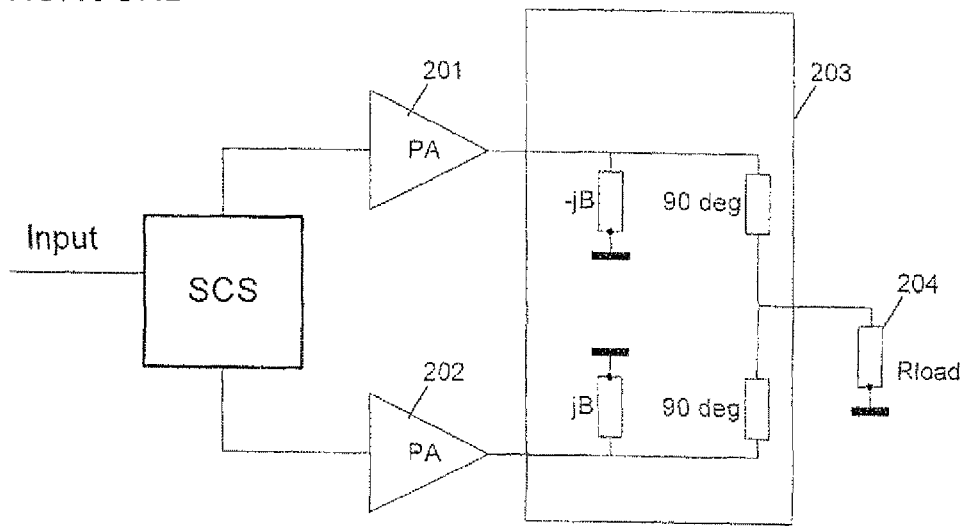
FIG. 2 is a schematic circuit diagram of a conventional two-way Chireix amplifier.
Figure 3:
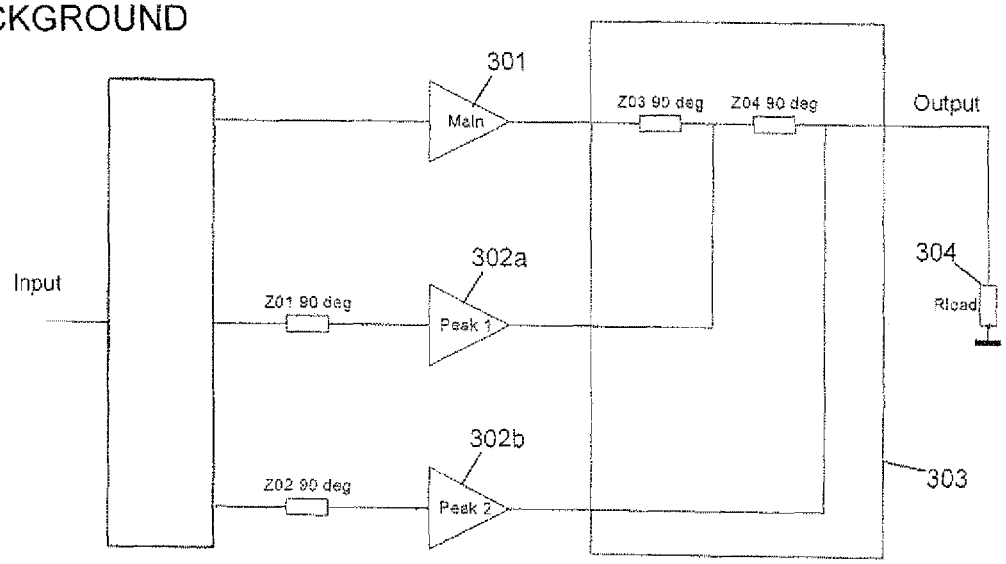
FIG. 3 is a schematic circuit diagram of a known three-way Doherty amplifier.
Figure 4:
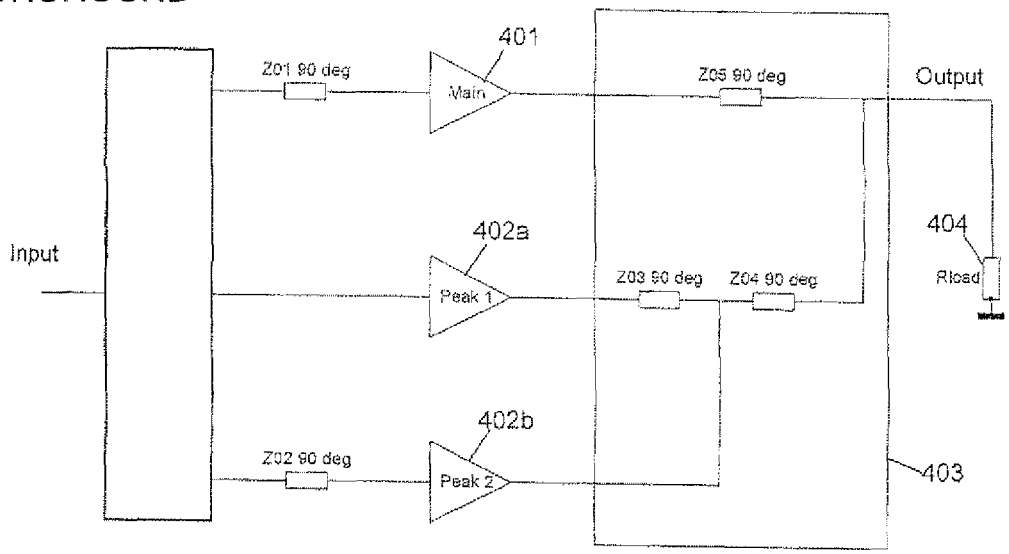
FIG. 4 is a schematic circuit diagram of an alternative known three-way Doherty amplifier.
Figure 5:
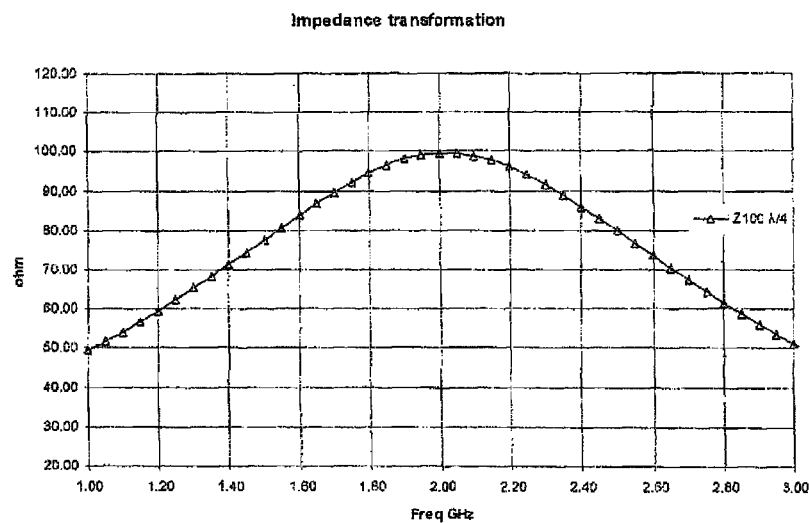
FIG. 5 is a plot of impedance as a function of frequency for the combiner stage of a conventional two-way Doherty amplifier.
Figure 6A:
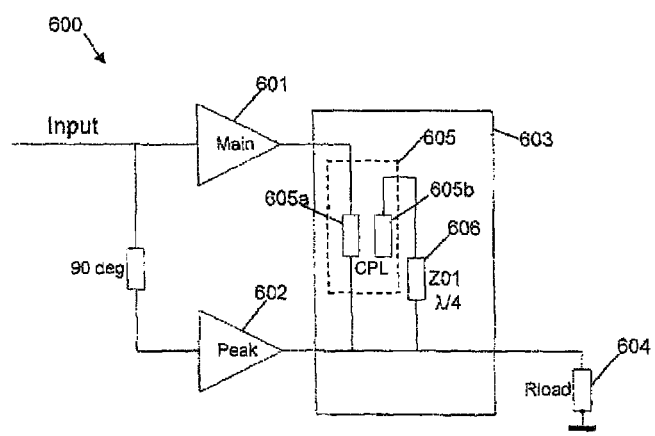
FIGS. 6A and 6B are schematic circuit diagrams of a two-way Doherty amplifier according to a first exemplary embodiment.

FIG. 6A illustrates a two-way symmetric Doherty power amplifier according to a first exemplary embodiment of the invention. As with the Doherty amplifier shown in FIG. 1, the amplifier comprises first and second amplifier stages 601, 602 having inputs connected to a common input signal, the second amplifier stage 602 being provided with a phase-shifted version of the input signal. The outputs of the amplifier stages 601, 602 are combined in a power combiner stage 603. The power combiner 603 comprises a pair of coupled transmission lines 605, each transmission line 605a, 605b having a length $\lambda/4$, i.e. a quarter wavelength based on the centre frequency of the amplifier.

As used herein, the term coupled lines, or coupled transmission lines, refers to two transmission lines that share common electrical and magnetic field.

An optional third transmission line 606 with a characteristic impedance Z01 and a length of at least $\lambda/4$ is also shown connected between the second one 605b of the coupled pair 605 and the output load 604, which is also connected to the output of the second amplifier stage 602. The coupled lines 605 may be characterised by their even and odd mode impedances or alternatively by their geometrical dimensions. The transmission lines 605a, 605b may for example be implemented as symmetric strip lines or asymmetric micro strip lines. The third transmission line 606 may also be implemented in a similar way. In alternative embodiments, the third transmission line may be absent, and replaced by a short circuit and the open end of the second coupled line 605b connected to ground.

As an illustrative example, the impedances of the transmission lines 605a, 605b, 606 may be chosen such that the even and odd mode impedances of the coupled lines are 80 $\Omega$($Z_{oe}$, or even mode impedance) and 44 $\Omega$($Z_{oo}$, or odd mode impedance), and the impedance of the transmission line 75 $\Omega$, and the electrical length of each of the lines selected to be one quarter wavelength. Other impedance values may alternatively be selected.

Figure 6B:
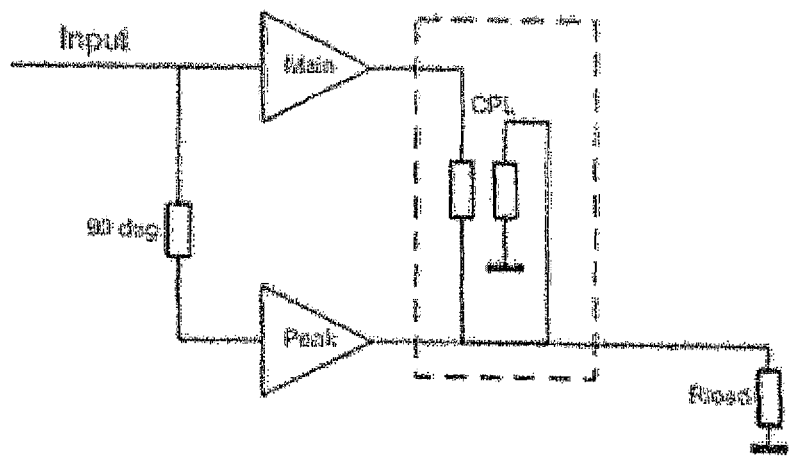

FIG. 6B depicts an alternate configuration of the embodiment shown in FIG. 6A. In this configuration, the second transmission line is connected directly to the output load connection and the ground.

Figure 7:
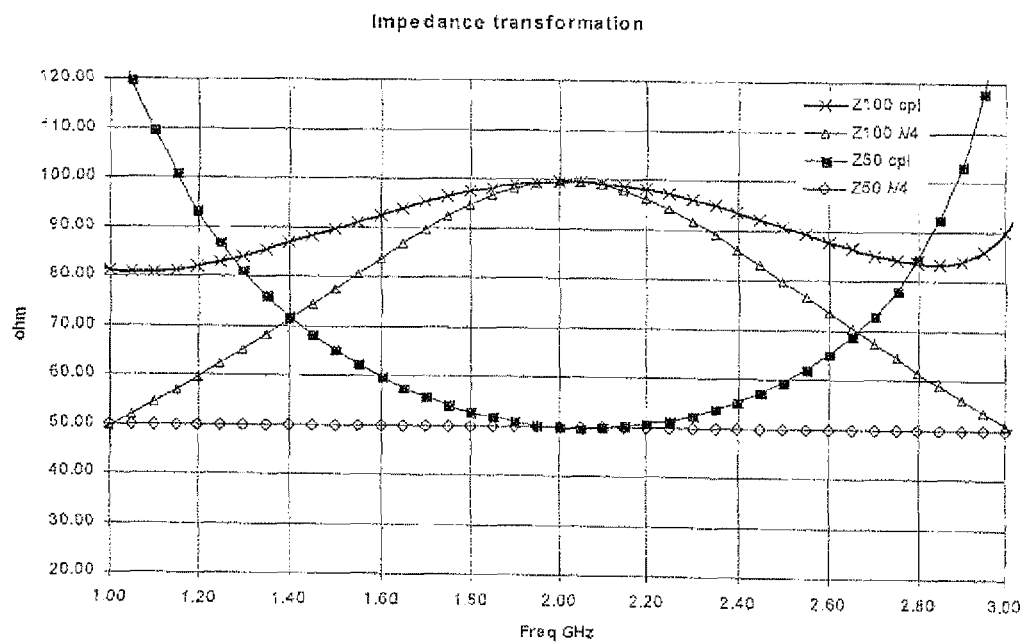
FIG. 7 is a plot of impedance as a function of frequency for a Doherty amplifier according to the first exemplary embodiment compared with a conventional two-way Doherty amplifier.

The performance of the coupled line Doherty power combiner of the embodiment in FIG. 6A is shown in FIG. 7, as compared to an equivalent conventional Doherty power combiner. The bandwidth of the combiner comprising a coupled pair of transmission lines at double load (indicated by the legend identified as Z100 in FIG. 7, with "Z100 $\lambda/4$" indicating the conventional combiner and "Z100 cpl" with the coupled transmission lines) shows an improvement in the bandwidth at a VSWR of 1.05 from 0.85 $f_0$ to around 1.15 $f_0$, or a relative BW of 30%, for a centre frequency $f_0$ of 2 GHz. This is a 50% effective increase of the BW compared with the conventional power combiner. The result of this is that the power amplifier performance at frequencies away from the centre frequency is improved. The centre frequency $f_0$ of the power combiner may be other than 2 GHz, which is shown in FIG. 7 by way of example only.

Figure 8:
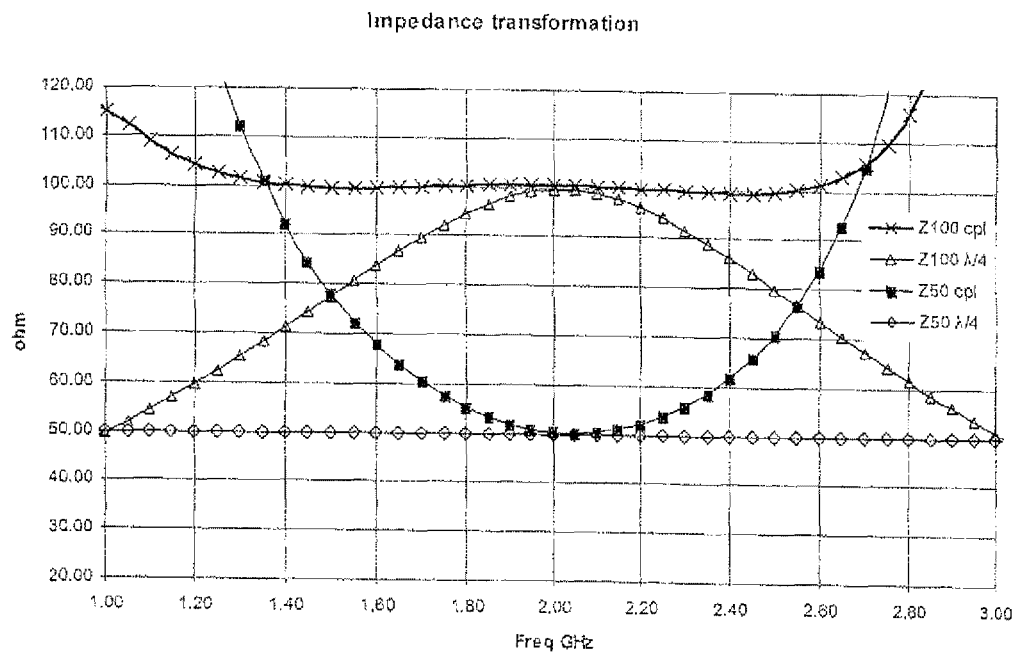
FIG. 8 is a further plot of impedance as a function of frequency for a Doherty amplifier according to the first exemplary embodiment compared with a conventional two-way Doherty amplifier.

FIG. 8 shows the performance of the exemplary combiner 603 further optimized for a maximally flat response at double load by adjusting the parameters of the coupled lines 605a, 605b and the transmission line 606. In this case the double load line bandwidth for a VSWR of 1.1 is from $0.6\, f_0$ to $1.35\, f_0$ (1.2 GHz to 2.7 GHz with $f_0=2$ GHz), equivalent to a relative bandwidth of 75%. For a VSWR of 1.05 the bandwidth is from $0.65\, f_0$ to $1.3\, f_0$ (1.3 GHz to 2.6 GHz for $f_0=2$ GHz), equivalent to a relative bandwidth of 65%.

As shown in the results in FIGS. 7 and 8, the performance of the amplifier 600 with a nominal load will deteriorate and become comparable to the performance of the conventional combiner at double load. The overall performance of the power amplifier 600 will however be improved, since most of the time the amplifier operates according to the double load line.

The optimal performance of different types of power amplifier may differ from case to case. In the case of a Chireix outphasing amplifier, the output is subject to much bigger load variations than with a two-way Doherty amplifier. The parameters of the coupled line combining structure to optimize the composite power amplifier performance according to predetermined criteria may calculated and adjusted accordingly, for example through the use of known computer simulation techniques.

Figure 9:
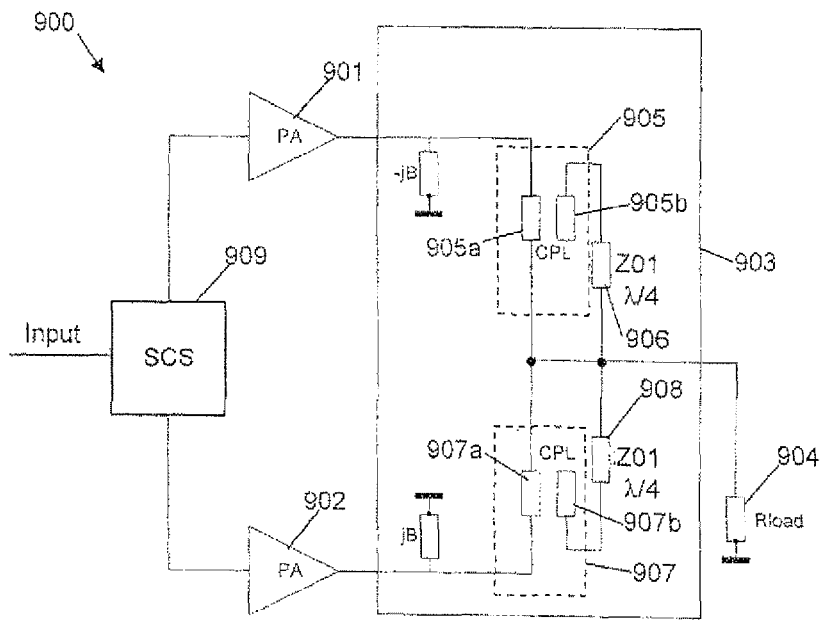
FIG. 9 is a schematic circuit diagram of a two-way Chireix amplifier according to a second exemplary embodiment.

Illustrated in FIG. 9 is a power amplifier 900 according to a second exemplary embodiment of the invention. The power amplifier 900 is in the form of a Chireix outphasing amplifier, having first and second amplifier stages 901, 902 with inputs connected to an SCS (Signal Component Separator) input stage 909, which performs signal processing of the input signal. Outputs of the amplifier stages 901, 902 are connected to a power combiner stage 903 comprising a first pair 905 of coupled first and second transmission lines 905a, 905b connected between the output of the first amplifier stage 901 and an output load 904, a second pair 907 of coupled third and fourth transmission lines 907a, 907b connected between the output of the second amplifier stage 902 and the output load 904. A second one 905b of the first pair 905 of coupled transmission lines is connected to the output load 904 via a fifth transmission line 906 and a second one 907b of the second pair 907 of coupled transmission lines is connected to the output load 904 via a sixth transmission line 908.

As with the Doherty amplifier embodiment of FIG. 6, the fifth and sixth transmission lines 906, 908 have a characteristic impedance Z01 and a length λ/4 or longer.

Figure 10:
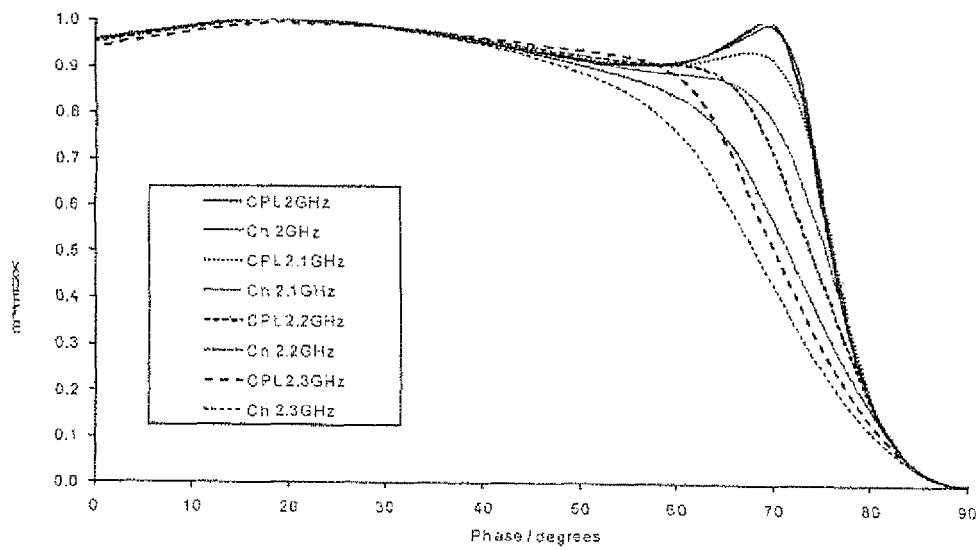
FIG. 10 is a plot of efficiency as a function of phase for a Chireix amplifier according to the second exemplary embodiment compared with a conventional Chireix amplifier.

The efficiency of the combiner 903 of the amplifier 900 of FIG. 9 is shown as a function of outphasing angle in FIG. 10, as compared with a conventional Chireix combiner. The results are shown at several different frequencies, ranging from 2 to 2.3 GHz. For outphasing angles exceeding 40 degrees, the combiner 903 performance (illustrated by lines marked according to the legends CPL 2 GHz, CPL 2.1 GHz, CPL 2.2 GHz and CPL 2.3 GHz) demonstrates a significantly higher efficiency over the entire frequency band compared with the conventional combiner (illustrated by lines marked according to the legends Ch 2 GHz, Ch 2.1 GHz, Ch 2.2 GHz and Ch 2.3 GHz), with the sole exception of the centre frequency 2 GHz where the performance is roughly equal.

Figure 11:
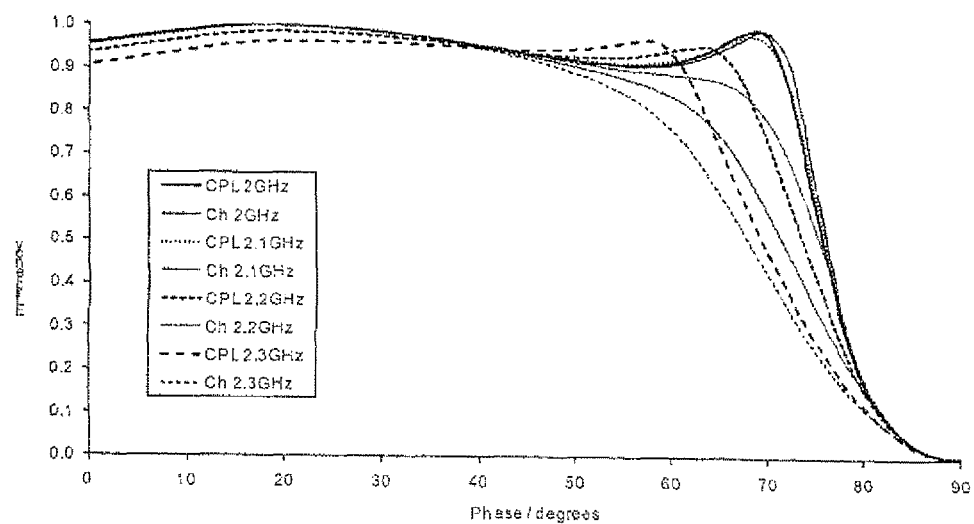
FIG. 11 is a further plot of efficiency as a function of phase for a Chireix amplifier according to the second exemplary embodiment compared with a conventional Chireix amplifier.

The results illustrated in FIG. 11 show the case when the combiner 903 is tuned for a flat frequency response. This illustrates that the combiner 903 can handle a 10% bandwidth centred around 2 GHz with a minimal deterioration in efficiency. If some small loss of efficiency can be tolerated at small outphasing angles (which, according to the signal statistics, may occur at rare instances), the combiner can be successfully implemented using a relative bandwidth of more than 25%, resulting in a significant improvement in power amplifier performance.

Figure 12:
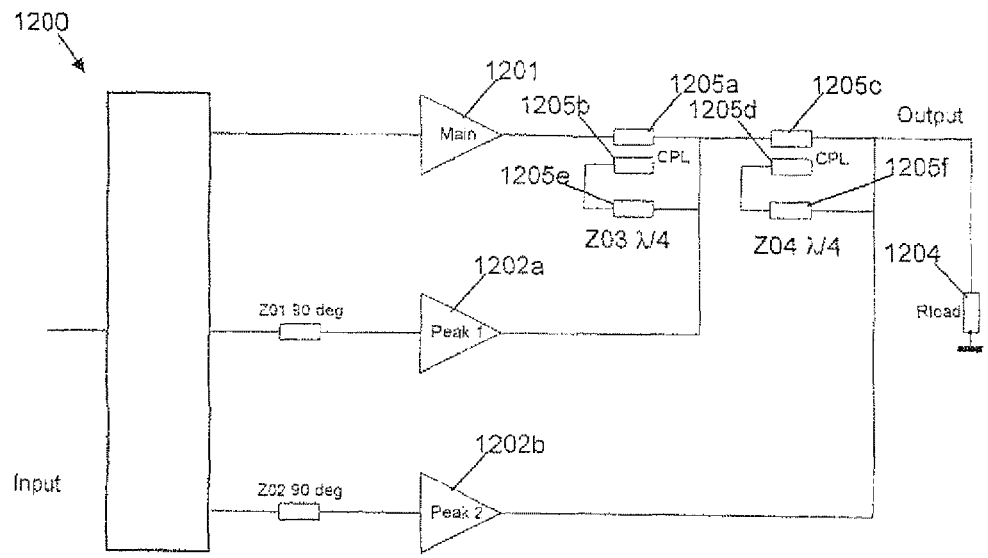
FIG. 12 is a schematic circuit diagram of three-way Doherty amplifier according to a first further alternative exemplary embodiment.
Figure 13:
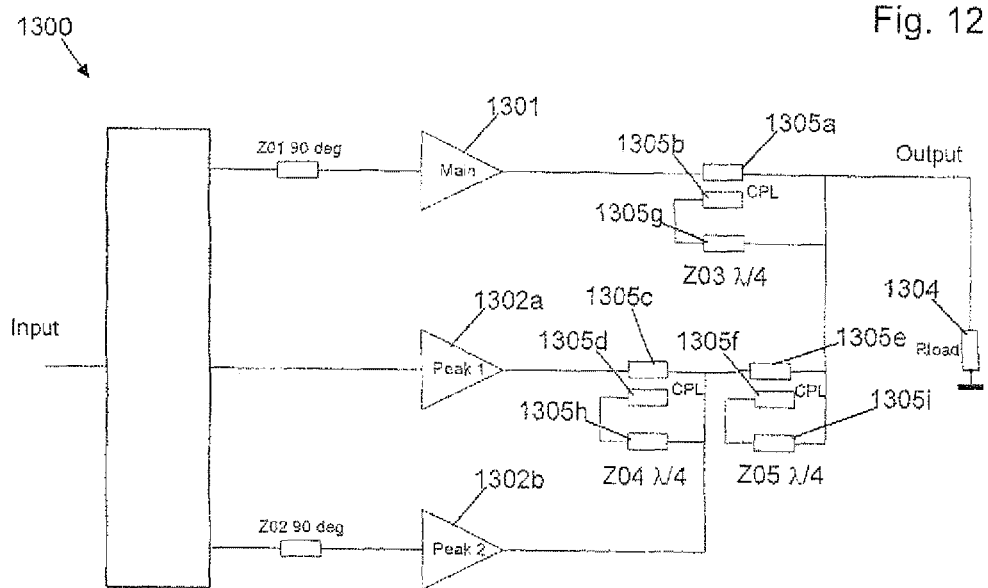
FIG. 13 is a schematic circuit diagram of a three-way Doherty amplifier according to a second further alternative exemplary embodiment.

Two further alternative exemplary embodiments of a three-way Doherty amplifier implementation are illustrated in FIGS. 12 and 13, these embodiments being equivalent to three-way Doherty amplifiers described in further detail in WO 2009/081341, but with the addition of coupled transmission lines connected between the outputs of further amplifier stages and the output load. According to a first alternative embodiment, shown in FIG. 12, the power amplifier 1200 comprises three amplifier stages including a first main amplifier stage 1201 and two further peak amplifier stages 1202a, 1202b. A coupled pair of first and second transmission lines 1205a, 1205b is connected between the output of the first amplifier 1201 and the output of the first peak amplifying stage 1202a and a second coupled pair of third and fourth transmission lines 1205c, 1205d is connected between the output of the second amplifier 1202a and the load 1204. As with the other embodiments described above, the second transmission line 1205b and the fourth transmission line 1205d are connected to the output load 1204 via fifth and sixth transmission lines 1205e, 1205f, each of which is at least a quarter wavelength. The first and second transmission lines 1205a, 1205b are connected to the output load 1204 via the third transmission line 1205c.

In the alternative embodiment shown in FIG. 13, the power amplifier 1300 also comprises three amplifier stages including a first main amplifier stage 1301 and two further peak amplifier stages 1302a, 1302b. A coupled pair of first and second transmission lines 1305a, 1305b is connected between the output of the first amplifier 1301 and the output load 1304, a second coupled pair of third and fourth transmission lines 1305c, 1305d is connected between the output of the second amplifier 1302a and the output of the third amplifier 1302b, and in addition a further coupled pair of fifth and sixth transmission lines 1305e, 1305f is connected between the output of the third amplifier stage 1302b and the load 1304. The second and sixth transmission lines 1305b, and 1305f are connected to the output load 1304 via seventh, and ninth transmission lines 1305g and 1305i, and the fourth transmission line 1305d is connected to the output of the third amplifying stage 1302b via the eight transmission line 1305h. Each of the second, sixth and ninth transmission lines is at least a quarter wavelength. The third and fourth transmission lines 1305c, 1305d are connected to the output load 1304 also via the fifth transmission line 1305e. The first to sixth transmission lines 1305a-f are preferably each a quarter wavelength in length.

Power amplifiers according to embodiments of the invention may be used to improve performance of contemporary high efficiency power amplifiers for use in telecommunication base stations using load modulation techniques. Doherty and Chireix outphasing power amplifier implementations may be particularly relevant where important power amplifier parameters such as gain, efficiency, linearity and output power need to be maintained over the entire operational frequency band, since the operational bandwidth of such amplifiers can be increased according to the embodiments disclosed herein.

Other embodiments are also within the scope of the invention, which is to be defined by the following claims.

The invention claimed is:

1. A power amplifier comprising:
an input connected to first and second amplifier stages; and
an output stage configured to combine phase shifted amplified outputs from the first and second amplifier stages and provide an amplified signal at an output of the power amplifier, wherein the output stage includes magnetically coupled first and second transmission lines connected between the output of the first amplifier stage and an output load connection and the first transmission line is connected between the output of the first amplifier stage and the output of the second amplifier stage, wherein the first and second transmission lines share a common electrical and magnetic field.

2. The power amplifier of claim 1, wherein the power amplifier is configured as a Doherty amplifier.

3. The power amplifier of claim 2, wherein the first transmission line is connected between the output of the first amplifier stage and the output load connection, and the second transmission line is connected to the output of the second amplifier stage.

4. The power amplifier of claim 3, wherein the first and second transmission lines have a length of a quarter of a wavelength of an operating frequency of the power amplifier.

5. The power amplifier of claim 4, wherein the second transmission line is connected to the output load connection via a third transmission line having a length of at least the quarter of the wavelength of the operating frequency of the power amplifier.

6. The power amplifier of claim 4, wherein the operating frequency is within a range of 1 to 3 GHz.

7. The power amplifier of claim 5, wherein the third transmission line is connected to the output load connection and ground.

8. The power amplifier of claim 2, further comprising:
a third amplifier stage having an output connected to the output load connection; and
magnetically coupled third and fourth transmission lines connected betweeen the output of the second amplifier stage and the output load connection.

9. The power amplifier of claim 8, further comprising:
magnetically coupled fifth and sixth transmission lines connected betweeen the output of the third amplifier stage and the output load connection.

10. The power amplifier of claim 1, wherein the power amplifier is configured as a Chireix outphasing amplifier, the power amplifier further comprising:
magnetically coupled third and fourth transmission lines connected betweeen the output of the second amplifier stage and the output load connection.

11. The power amplifier of claim 10, wherein the first to fourth transmission lines each have a length of a quarter of a wavelength of an operating frequency of the power amplifier.

12. The power amplifier of claim 11, wherein the second transmission line is connected to the output load connection via a fifth transmission line and the fourth transmission line is connected to the output load connection via a sixth transmission line, the fifth and sixth transmission lines each having a length of at least the quarter of the wavelength of the operating frequency of the power amplifier.

13. A method of operating a power amplifier, the method comprising:
receiving a signal at an input of the power amplifier;
dividing the received signal between first and second amplifier stages;
amplifying the divided signal by the first and second amplifier stages;
combining the resulting amplified signals from outputs of the first and second amplifier stages in an output stage, wherein a first transmission line is connected between the output of the first amplifier stage and the output of the second amplifier stage, a second transmission line is connected between the output of the first amplifier stage and an output load connection, and the first and second transmission lines share a common electrical and magnetic field;
providing an amplified output signal at an output of the power amplifier.

14. The power amplifier of claim 1, wherein the coupled first and second transmission lines are strip lines.

15. The power amplifier of claim 14, wherein the strip lines are symmetric strip lines.

16. The power amplifier of claim 14, wherein the strip lines are asymmetric strip lines.

17. A power amplifier comprising:
an input connected to a first amplifier stage, a second amplifier stage, and a third amplifier stage;
a first pair of magnetically coupled transmission lines connected to an output of the first transmission stage; and
a second pair of magnetically coupled transmission lines connected to an output of the second amplifier stage, wherein the first and second pairs of magnetically coupled transmission lines share a common electrical and magnetic field.

18. The power amplifier of claim 17, wherein the first pair of magnetically coupled transmission lines is connected to the output of the second transmission stage and the second pair of magnetically coupled transmission lines is connected to an output load connection.

19. The power amplifier of claim 17, further comprising:
a third pair of magnetically coupled transmission lines connected between the first pair of magnetically coupled transmission lines and the second pair of magnetically coupled transmission lines.

20. The power amplifier of claim 19, wherein both the first pair of magnetically coupled transmission lines and the third pair of magnetically coupled transmission lines are connected to an output load connection.

* * * * *